(12) United States Patent  
Cok et al.

(10) Patent No.: US 8,896,505 B2
(45) Date of Patent: Nov. 25, 2014

(54) DISPLAY WITH PIXEL ARRANGEMENT

(75) Inventors: Ronald S. Cok, Rochester, NY (US); Michael E. Miller, Honeoye Falls, NY (US)

(73) Assignee: Global OLED Technology LLC, Herndon, VA (US)

( * ) Notice: Subject to any disclaimer, the term of this patent is extended or adjusted under 35 U.S.C. 154(b) by 1294 days.

(21) Appl. No.: 12/483,310

(22) Filed: Jun. 12, 2009

(65) Prior Publication Data

US 2010/0315319 A1 Dec. 16, 2010

(51) Int. Cl.
G09G 3/22 (2006.01)
G09G 3/20 (2006.01)
G09G 3/32 (2006.01)

(52) U.S. Cl.
CPC .......... G09G 3/20 (2013.01); G09G 2320/0233 (2013.01); G09G 2300/0426 (2013.01); G09G 3/2088 (2013.01); G09G 2300/0452 (2013.01); G09G 2320/0285 (2013.01); G09G 3/3208 (2013.01)
USPC ............... 345/77; 345/694; 345/695; 345/92; 345/93; 349/144

(58) Field of Classification Search
None
See application file for complete search history.

(56) References Cited

U.S. PATENT DOCUMENTS

| 4,661,809 | A | * | 4/1987 | Anderson et al. ............... 345/86 |
| 4,769,292 | A |   | 9/1988 | Tang et al. |
| 4,931,787 | A | * | 6/1990 | Shannon ........................ 345/93 |
| 5,061,569 | A |   | 10/1991 | VanSlyke et al. |
| 6,011,531 | A | * | 1/2000 | Mei et al. ........................ 345/92 |
| 6,771,028 | B1 |   | 8/2004 | Winters |
| 7,368,868 | B2 |   | 5/2008 | Sakamoto |
| 7,382,384 | B2 |   | 6/2008 | Winters et al. |
| 7,619,815 | B2 |   | 11/2009 | Nam et al. |
| 8,390,532 | B2 |   | 3/2013 | Hanamura et al. |
| 2002/0057266 | A1 |   | 5/2002 | Miyajima |
| 2003/0132895 | A1 |   | 7/2003 | Berstis ............................ 345/55 |
| 2003/0184665 | A1 |   | 10/2003 | Berstis |
| 2005/0140907 | A1 | * | 6/2005 | Yun ............................... 349/144 |
| 2005/0231447 | A1 |   | 10/2005 | Hu et al. |
| 2006/0022989 | A1 | * | 2/2006 | Takashima et al. ........... 345/565 |
| 2006/0055864 | A1 | * | 3/2006 | Matsumura et al. .......... 349/187 |
| 2006/0197458 | A1 | * | 9/2006 | Winters et al. ............. 315/169.1 |
| 2006/0280360 | A1 | * | 12/2006 | Holub ............................ 382/162 |
| 2007/0176859 | A1 | * | 8/2007 | Cok et al. ........................ 345/76 |

FOREIGN PATENT DOCUMENTS

| JP | 2001-350196 A | 12/2001 |
| JP | 2004-184978 | 2/2004 |
| JP | 2005-003990 | 6/2005 |
| WO | WO 2010/008441 A1 | 1/2010 |

* cited by examiner

*Primary Examiner* — Jesus Hernandez
(74) *Attorney, Agent, or Firm* — Global OLED Technology LLC

(57) ABSTRACT

A display, including a substrate having a display area including first and second non-overlapping pixel groups and a gutter located between the first and second pixel groups, the gutter having a dimension in a first direction separating the first and second pixel groups, and each pixel group includes a plurality of pixels, each pixel having three or more differently colored sub-pixels; and wherein the pixel centers of the pixels in each pixel group are arranged in a regular two-dimensional array having one dimension parallel to the first direction, and wherein the pixels within a pixel group are separated by an inter-pixel separation in the first direction; and one or more electrical elements arranged within the gutter, each subpixel being connected to one of the one or more electrical elements, wherein the gutter dimension is greater than the inter-pixel separation, so that artifacts in a displayed image are reduced.

14 Claims, 9 Drawing Sheets

DISPLAY WITH PIXEL ARRANGEMENT

CROSS REFERENCE TO RELATED APPLICATIONS

Reference is made to commonly-assigned U.S. patent application Ser. No. 12/191,478 filed Aug. 14, 2008 entitled "OLED DEVICE WITH EMBEDDED CHIP DRIVING" to Dustin L. Winters et al., the disclosure of which is incorporated herein.

FIELD OF THE INVENTION

The present invention relates to a display having pixel groups, and more particularly to the organization of such groups on the display to thereby reduce current density of organic electroluminescent emitters while maintaining image quality.

BACKGROUND OF THE INVENTION

Flat-panel displays based upon many technologies, including liquid crystal, plasma, electro-luminescent (EL) display technologies, are well known in the art. Generally, these displays include a substrate having a display area. Individual light-emitting elements or subpixels are then arranged within this display area. Typically, a fixed and repeated distance in both the horizontal and vertical directions separates the light-emitting portions of each of these subpixels. This gap separating light-emitting portions of subpixels often includes electrical elements for providing drive signals to the light-emitting portions of the subpixels.

One of the characteristics critical to the performance of these flat-panel displays is the aperture ratio of the light-emitting portion of each subpixel, which is the portion of the area of each subpixel that emits light. This aperture ratio has a significant influence on the efficiency of displays that modulate light, such as liquid crystal displays, and has a significant influence on the lifetime of emissive displays, such as Organic Light Emitting Displays (OLEDs), in which each subpixel produces and emits light. To increase the aperture ratio, the size of electrical elements within the gap separating the light-emitting portions of the subpixels can be reduced. However, when these electrical elements are too small, they are unable to perform critical functions, such as distributing power among the subpixels within the display area. Within the display area, space is also required between the light-emitting portion of each subpixel and the electrical elements, as well as between many of the adjacent electrical elements within the display area, to prevent shorting and to allow tolerances for placement variability within the manufacturing process.

It is important that the size of many of the electrical elements is fixed for a particular display size. For instance, the size of a power bus is often determined with respect to the overall size of the display and the amount of current the power buss is required to distribute. Therefore, as the resolution of the display is increased and more subpixels are designed to fit within the display area, the aperture ratio of the light-emitting portions of these subpixels decreases as the resolution of the display is increased. This constraint directly conflicts with the display market's demand for high-resolution displays.

Typically, the subpixels within flat-panel displays are equally separated in the horizontal and vertical direction as each subpixel is formed from the same or very similar arrangements of a light-emitting portion and electrical elements. This arrangement is replicated over the entire display area. It is accepted in the art that imaging artifacts are reduced by this regular, repetitive arrangement of light-emitting and non-light-emitting subpixel portions. This repetitive arrangement is typically employed even in full-color displays that have different subpixels for emitting each of three or more colors of light.

It is known in the art to employ pixel arrangements in which the same subpixel layout is not replicated across the entire display. For example, Miyajima in US Publication No. 20020057266, entitled "Active Matrix Display Device" describes a liquid crystal display wherein a power line is shared between two rows of liquid crystal subpixels. In this arrangement the same subpixel arrangement is not repeated across the entire substrate but instead even and odd rows of subpixels within the display area each have a different layout and a different separation. This arrangement has the advantage that because power lines are shared among rows of subpixels, the size of the power buss is reduced and the tolerance required around one of the power busses is eliminated, allowing the aperture ratio of the liquid crystal modulators to be increased. However, within this arrangement, Miyajima teaches a method to maintain equal space between the light-emitting portions of the subpixels to avoid imaging artifacts. It is worth noting that although even and odd rows of subpixels had different arrangements, this arrangement is specific to displays having alternate rows of subpixels with different arrangements.

Winters in U.S. Pat. No. 6,771,028, entitled "Drive circuitry for four-color organic light-emitting device", Winters et al. in U.S. Pat. No. 7,382,384 entitled "OLED displays with varying sized pixels", and Cok et al. in US Publication No. 20070176859, entitled "EL device having improved power distribution" each discuss EL display pixel arrangements in which power busses or other electrical elements are shared among groups of four subpixels, which form a four-color pixel. Once again, this arrangement has the advantage of sharing power busses or other electrical elements between two adjacent rows or columns of subpixels. Sakamoto in U.S. Pat. No. 7,368,868 entitled "Active Matrix Organic EL Display panel" discusses an EL display having a different-sized gap between subpixels within one direction than in the other direction. Each of these disclosures within the EL display art, however, shows or describes pixel arrays in which the distance between all pixels is equal along at least one direction, wherein a pixel is the smallest possible repeating group of subpixels containing all colors of subpixels within the display.

Displays or sensors having variable-sized and variable-spaced light-collection or light-emitting elements are also known. For example Berstis in U.S. Patent Application Publication No. 20030184665, entitled "Anti-moire pixel array having multiple pixel types" discusses of one such arrangement. However, this disclosure does not discuss or describe the routing of electrical elements within this random array. The requirement for the electrical elements and the light-emitting portion of the subpixels to share space within the display area, as well as manufacturing yield and performance considerations which dictate the need for the electrical elements to nearly follow a regular grid, makes such an arrangement impractical for most flat-panel display applications.

As the resolution of a display increases further, additional increases in aperture ratio are necessary to improve the efficiency and lifetime of flat-panel displays. This increase in aperture ratio should be achieved without producing undesirable image artifacts that degrades the image quality of the display to an unacceptable level.

SUMMARY OF THE INVENTION

According to the present invention, there is provided a display, comprising:
a) a substrate having a display area less than the size of the substrate, wherein the display area includes a first and a second non-overlapping pixel group and a gutter located between the first and the second pixel group, the gutter has a dimension in a first direction separating the first and second pixel groups, and each pixel group includes:
  i) a plurality of pixels, each pixel having three or more differently colored sub-pixels; and
  ii) wherein the pixel centers of the pixels in each pixel group are arranged in a regular two-dimensional array having one dimension parallel to the first direction, and wherein the pixels within a pixel group are separated by an inter-pixel separation in the first direction; and
b) one or more electrical elements arranged within the gutter, each subpixel being connected to one of the one or more electrical elements, wherein the gutter dimension is greater than the inter-pixel separation, so that artifacts in a displayed image are reduced.

By arranging the organization of the pixels, a more efficient pixel design is provided that increases the light-emitting area of an emissive display and thereby reduces current density of the emitters. This advantage is obtained while reducing the visibility of any artifacts that arise as a result of such arrangements and thereby maintaining image quality.

DETAILED DESCRIPTION OF THE INVENTION

Figure 1:
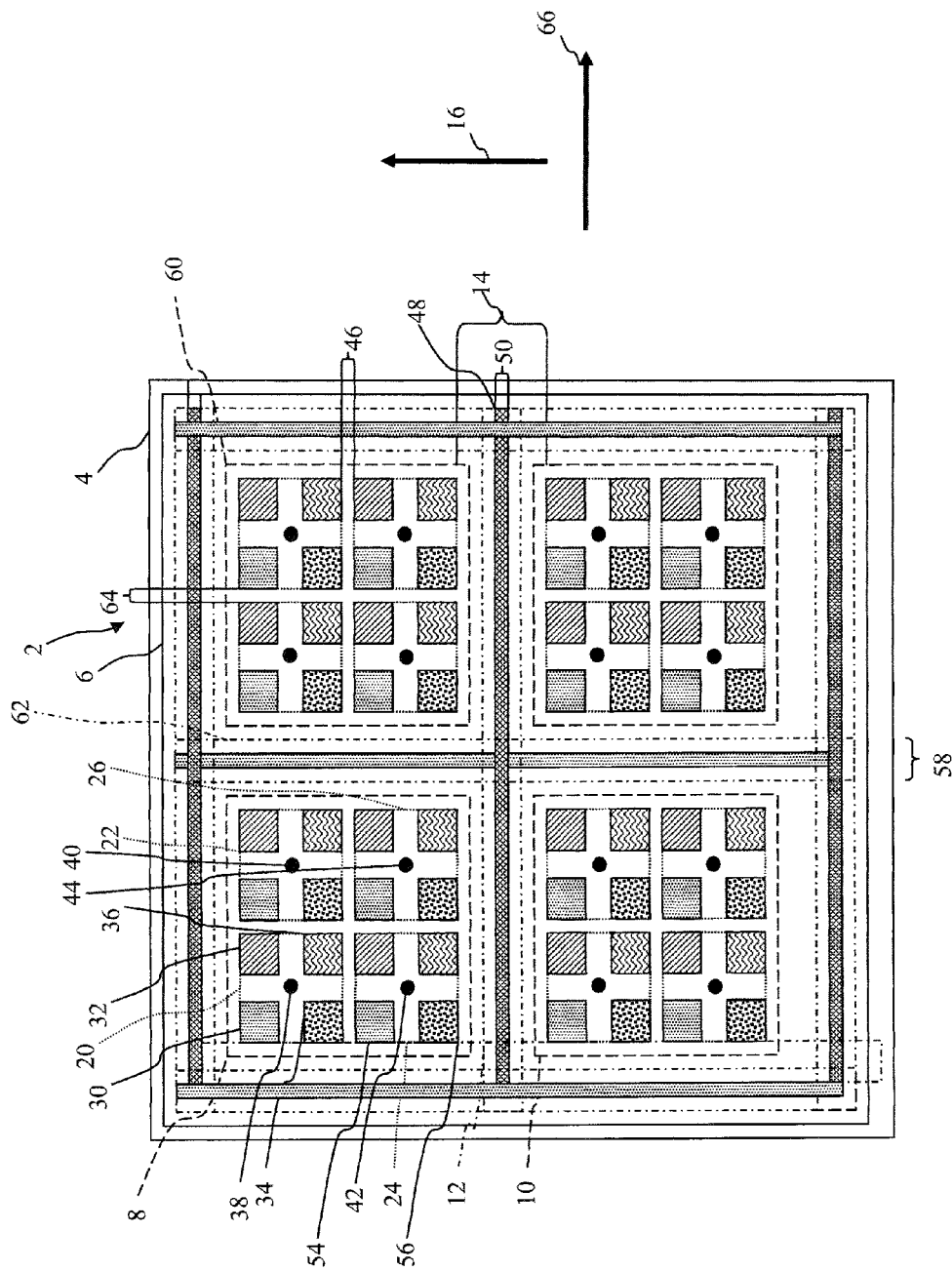
FIG. 1 is a top view of a portion of a display according to an arrangement of the present invention.

The present invention provides a display having an improved fill factor, providing reduced current densities in an electro-luminescent (EL) display with reduced image artifacts. An example of a portion of such a display 2 is shown in FIG. 1. As shown, this display 2 includes a substrate 4 and a display area 6 containing pixels, wherein the display area 6 is less than the size or area of the substrate 4. The display area 6 includes a first and a second non-overlapping pixel group 8, 10 and a gutter 12 located between the first and the second non-overlapping pixel group 8, 10. This gutter 12 contains electrical elements for providing power or control signals to multiple rows or columns of pixels as will be further explained. This gutter 12 has a dimension 14 in a first direction, indicated by arrow 16 separating the first and second pixel groups 8, 10. The gutter dimension 14 is measured to include the space between pixels as shown in FIG. 1. In a typical arrangement, an edge of a pixel 24, 26 adjacent to the gutter 12, an edge of the pixel group 8, and an edge of the gutter 12 are coincident. However, they are drawn using non-overlapping lines in FIG. 1 to help illustrate the presence of each individual entity. It should be noted that the gutter is generally reserved for electrical elements and for providing space between these electrical elements and other elements within the display. As used in this disclosure, a gutter will not contain light emitting regions of pixels.

Each pixel group 8, 10 includes a plurality of pixels 20, 22, 24, 26 with each pixel 20 having three or more differently colored sub-pixels 30, 32, 34, 36. One possible arrangement of the subpixels 30 32,34,36 within each pixel 20 is shown in FIG. 1. As shown, the pixel 20 contains red 32, green 30, and blue 34 subpixels. Each pixel 20,22,24, 26 in this specific arrangement additionally includes at least one additional subpixel 36 for emitting a different color of light, which will typically be selected among white, cyan, or yellow colors of light. Within this disclosure, the additional subpixel 36 will often be referred to as a white subpixel and a white light emitting subpixel will often be preferred as the additional subpixel. However, one skilled in the art will realize that the present invention applies equally well to displays that employ additional subpixels that emit cyan or yellow light. For the purpose of this disclosure, a "pixel" is defined as any group of three or more differently colored subpixels that are repeated on the display. Typically, it will be possible to illuminate the subpixels in a pixel to emit white light. A "subpixel" is defined as an individually addressable element, which emits light. As such, light is emitted from the entire area of a subpixel 30, 32, 34, 36. However, a pixel 20 contains the subpixels 30,32, 34, 36 and the area between the subpixels. Each pixel 20 will have a pixel center 38, 40, 42,44, which is determined by calculating the geometric center of the subpixels 30, 32, 34, 36 within a pixel 20.

The pixel centers 38, 40, 42, 44 of the respective pixels 20, 22, 24, 26 in each pixel group 8 are arranged in a regular two-dimensional array having one dimension arranged in a direction parallel to the first direction as indicated by arrow 16. Each pixel 20 has a pair of edges that are parallel and a pair of edges that are perpendicular to the first direction indicated by the arrow 16. These edges are specified by a line that lies parallel or perpendicular to the first direction indicated by arrow 16 and is as close to the pixel center 38, 40, 42, 44 as possible while enclosing the entirety of each subpixel within the pixel. For example, the pixel edges are indicated by the lines indicating pixel 20, as this line encloses the entirety of the subpixels 30,32, 34, and 36 while having two edges parallel and two edges perpendicular to the direction indicated by the arrow 16. Pixels, for example pixels 20 and 22, within a pixel group are separated by an inter-pixel separation 46 in the first direction, which is the distance between the edge of a pixel 20 that is perpendicular to the first direction and the nearest parallel edge of a neighboring pixel 22.

The display further includes one or more electrical elements 48, which are arranged within the gutter 12. Each subpixel within the pixel group is connected to an electrical element. The gutter dimension 14 is greater than the inter-pixel separation 46 and thus the separation between pixel groups is greater than the inter-pixel separation. This arrangement is provided such that artifacts in a displayed image are reduced. As will be discussed further, the artifacts in the display are reduced through multiple arrangements or display-drive methods.

In particular arrangements of the present invention, such as the one depicted in FIG. 1, each electrical element 48 has an element dimension 50 in the first direction indicated by arrow 16 and the gutter dimension 14 is greater than the element dimension 48. Therefore, each electrical element 48 has a respective element dimension 50 in the first direction indicated by arrow 16, and the gutter dimension 14 is greater than any of the element dimensions. Also as shown, in FIG. 1, each pixel group 8 includes three or more subpixels 30,34, 54, 56 arranged in the first direction as indicated by arrow 16. Further as depicted in FIG. 1 the display area 6 includes a first, a second and a third non-overlapping pixel group 8, 10, 60. The gutter dimension 14 is measured between the first and the second pixel groups 8, 10 in the first direction as indicated by the arrow 16. Additionally, a second gutter 62 having a second gutter dimension 58 is located between the first and the third pixel group 8, 60 in a second direction, different from the first direction, as indicated by arrow 66. The second gutter dimension 58 is measured between the first and third pixel group in the second direction. The respective dimensions 14, 58 of each gutter 12, 62 are each greater than the respective inter-pixel separations 46, 64 in the respective directions of the pixel groups. That is, the dimension 14 of gutter 12 is greater than the pixel separation 46 and the dimension 58 of gutter 62 is greater than the pixel separation 64. Also, as shown in FIG. 1 the first direction, indicated by arrow 16 and the second direction, indicated by arrow 66, are orthogonal within some arrangements.

Figure 2:
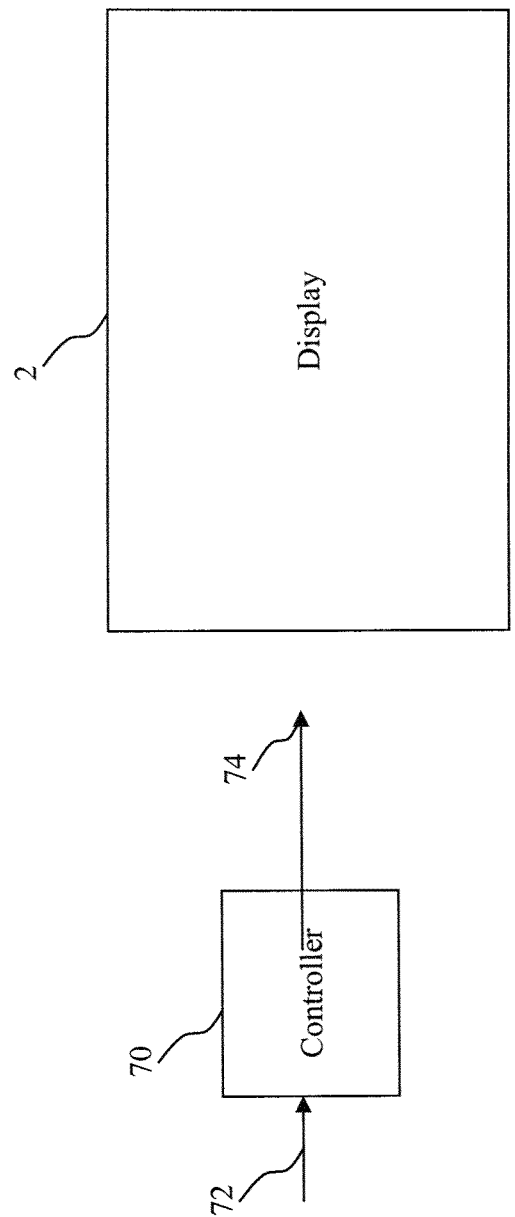
FIG. 2 is a schematic of a display of the present invention, including a controller.

Referring to FIG. 2, in some arrangements, the display 2 of the present invention can include a controller 70 for receiving an input image signal 72 and providing a drive signal 74 for controlling the luminance of the pixels in response to the input image signal 72 to present an image on the display 2. Typical input image signals 72 include a three-color signal having a regular sampling grid, that is the signal is typically formatted to present an image on a display having an array of pixels having coincident red, green, and blue light emission, wherein the center of each of the pixels are on a sampling grid with equally-spaced pixel centers. When the input image signal is presented on a display, such as the display 2 of the present invention, lines and edges in the image are typically distorted. To avoid this distortion, in one arrangement, the controller 70 will include interpolation circuitry for processing the input image signal to compensate for the difference between the dimension of the gutter 14 and the pixel group separation 46 within the first direction. In some arrangements, this same interpolation circuitry also compensates for the presence of non-coincident red, green, and blue light emission.

Figure 3:
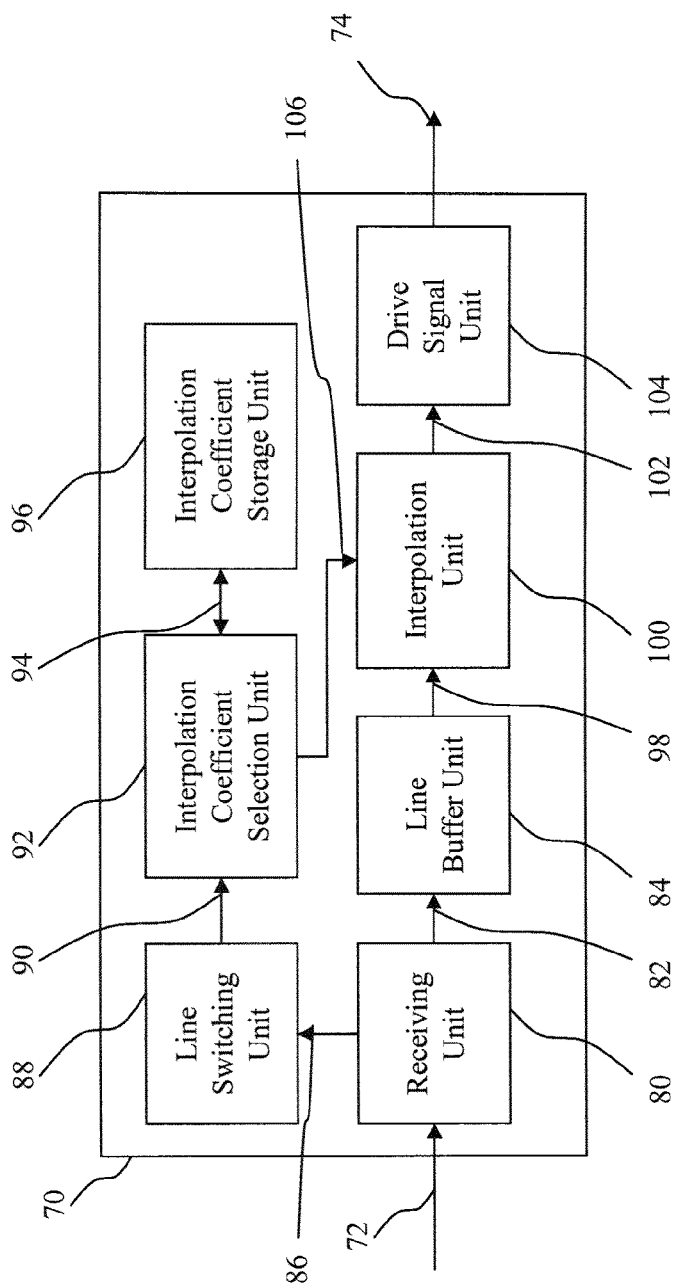
FIG. 3 is a schematic diagram of a controller useful in an arrangement of the present invention.

An arrangement of a controller including the necessary interpolation circuitry is shown in FIG. 3. As shown in this figure, the controller 70 will receive an input image signal 72, and supply this input image signal to a receiving unit 80. This receiving unit performs any processing necessary to format the data, including decompressing the input image signal 72 or converting the color space of the input image signal 72 to form a received input image signal 82. The received input image signal 82 will then be fed into a line buffer unit 84 for storing at least a row of data. Simultaneously, the receiving unit provides end-of-line signals 86 indicating the end of a line corresponding to a rescan signal within the input image signal 72 to a line-switching unit 88. This line-switching unit 88 provides a line-selection signal 90. This line-selection signal 90 will indicate the location of the line in the input image signal 72 with respect to a gutter 12 on the display 2. For instance, in the example of the display of FIG. 1, the line selection signal 90 can indicate a 1 for a row below a gutter or a 2 for rows just above the gutter. In some arrangements, the line-switching unit 88 will also provide a different code for each pixel of data that is provided within the line-selection signal 90. In response to the line-selection signal 90, the interpolation coefficient selection unit 92 will exchange selection and interpolation signals 94 from the interpolation coefficient storage unit 96 and provide an interpolation coefficient signal 106 to the interpolation unit 100, which will apply interpolation using multiple pixels of data in the first direction to provide an interpolated signal 102. The interpolation unit 100 will complete this interpolation by obtaining the buffered input image signal 98 from the line buffer unit 84 and interpolating these values using the interpolation coefficient signal 106 to provide the interpolated signal 102. This interpolated signal 102 will then be converted to drive signals 74 by the drive signal unit 104.

By performing this modified interpolation, the subpixels farther from the gutter will be weighted to rely more heavily on the input image signal values corresponding to spatial locations further from the gutters than the image signal values corresponding to spatial locations near the gutters. As such, application of this spatial interpolation technique will reduce spatial distortions, including improving the straightness of lines displayed across pixel groups. This improvement of line straightness will be particularly useful for pixel groups on opposite sides of the gutters.

Other image-processing options are employed in some embodiments to further reduce the visibility of artifacts in images presented on the display 2. The display 2 depicted in FIG. 1 enables one such technique. As shown in FIG. 1 each pixel 20 includes a repeating arrangement of four subpixels 30, 32, 34, 36, each subpixel emitting a different color of light and each pixel 20 including at least two subpixels 30, 34 for emitting corresponding different colors of light in the first direction, wherein each pixel group 8 includes multiple pixels 20, 24 in the first direction as indicated by arrow 16. When each pixel 8 includes four subpixels 30, 32, 34, 36, any color that is specified in a three-color input image signal is made by combining light from two unique groups of no more than three of the four subpixels. This arrangement enables one to shift the perceived center of the pixel by forming the majority of the pixel luminance from the subpixels nearer on the pixel edge or the opposing pixel edge. Therefore, in some arrangements, the display 2 further includes a controller such as controller 70 in FIG. 2 for receiving an input image signal 72 that, in response to a flat-field input image signal, provides a drive signal 74 for controlling the luminance of the subpixels such that subpixels adjacent to the gutters provide more luminance than the remaining subpixels, for example, the subpixels internal to each pixel group. A flat-field input image signal is one in which the desired luminance of each pixel is the same.

In a more explicit example, the arrangement of subpixels 30,32, 34, 36 is repeated in every pixel 20 in the active display area 6. These subpixels include subpixels 30 and 36 for emitting green and white light respectively, as well as subpixels 32 and 34 for emitting red and blue light respectively. In this arrangement, the vast majority of the luminance provided by the pixel will be provided by the green and white light-emitting subpixels 30, 36. Therefore, by changing the drive method to preferentially employ either the green or white subpixels, depending on which is closer to an adjacent gutter, the perceived center of the pixel will be shifted nearer to the area within the gutter and, as observed by the inventors, reduce the visibility of the gutter, thus reducing artifacts in the presented image.

Figure 4:
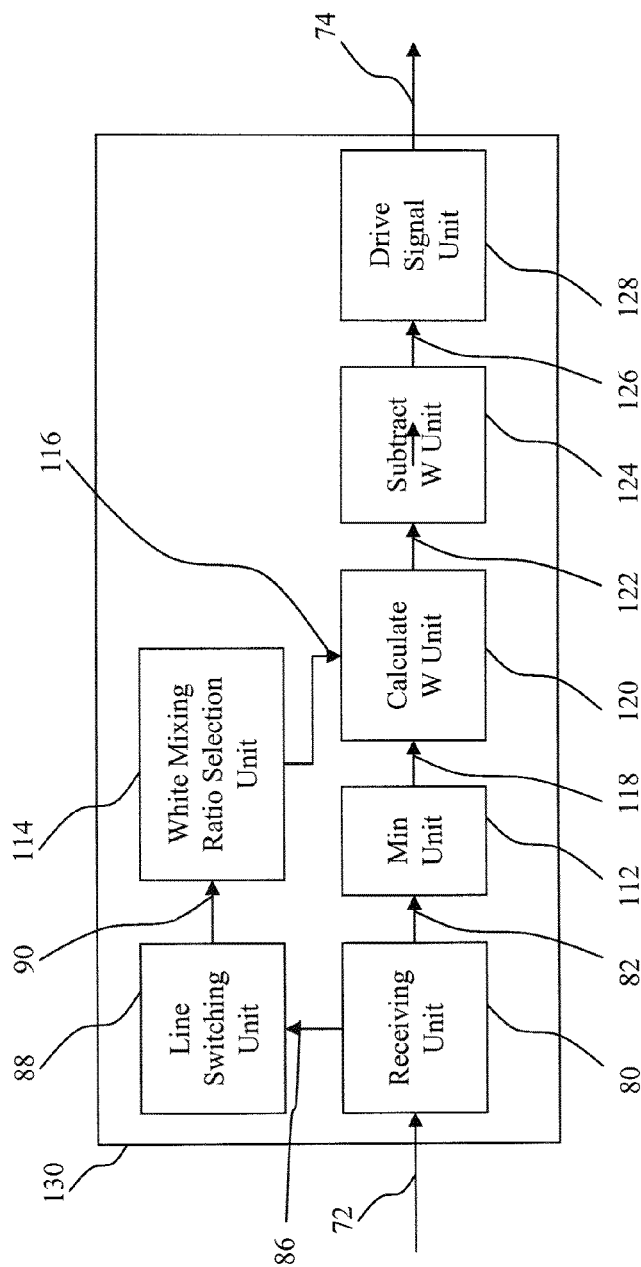
FIG. 4 is a schematic diagram of a controller useful in an arrangement of the present invention.

An arrangement of a controller including the necessary three-to-four color conversion circuitry is shown in FIG. 4. This controller 130 has some of the same components as shown in the controller of FIG. 3 and in some arrangements the unique functions of this controller are integrated with the functions of the controller 70 in FIG. 3. As shown in this figure, the controller 130 will receive an input image signal 72, and supply this input image signal to a receiving unit 80. This receiving unit 80 performs any processing necessary to format the data, including decompressing the input image signal 72 or converting the color space of the input image signal 72 to form a received input image signal 82. The received input image signal 82 can be a three-color input image signal containing three input signal values for each pixel represented in the input image signal and can be fed into min unit 112 for calculating the minimum value of the three input signal values for each pixel in the input image signal 72. Simultaneously, the receiving unit provides end of line signals 86 indicating the end of a line corresponding to a rescan signal within the input image signal 72 to a line-switching unit 88. This line-switching unit 88 provides a line selection signal 90. This line-selection signal 90 will indicate the location of the line in the input image signal 72 with respect to a gutter 12 on the display 2. For instance, in the example of the display of FIG. 1, the line-selection signal 90 can indicate a 1 for a row below a gutter or a 2 for rows just above the gutter. In some arrangements, the line-switching unit 88 will also provide a different code for each pixel of data provided within the line-selection signal 90. In response to the line-selection signal 90, the white-mixing ratio selection unit 114 will provide a signal indicating the ratio of the luminance to be produced by the white subpixel. If the line-selection signal is such that the input image data corresponds to a pixel having a green subpixel adjacent to a gutter, a low value, for example zero, will be assigned and if the data corresponds to a pixel having a white subpixel adjacent to a gutter, a high value, for example one, will be assigned as a white-mixing ratio signal. This white-mixing ratio signal 116 will then be provided to the calculate W unit 120. The calculate W unit will multiply the white-mixing ratio signal 116 by the minimum values in the min signal 118 determined from the min unit 112 to calculate a W signal 122 for driving the white subpixel. The W signal 122 will be provided to the subtract W unit 124, which will subtract this value from the three-color signal in the received input image signal 82 to obtain output R, G, and B signals 126. The RGBW signals 126 will then be provided to the drive signal unit 128 which will convert these values into a drive signal 74. In embodiments employing an additional pixel that emits yellow or cyan light, this white mixing ratio signal 116 will indicate the mixing ratio of the yellow or cyan light that is required and this signal will be applied in an analogous manner.

Figure 5:
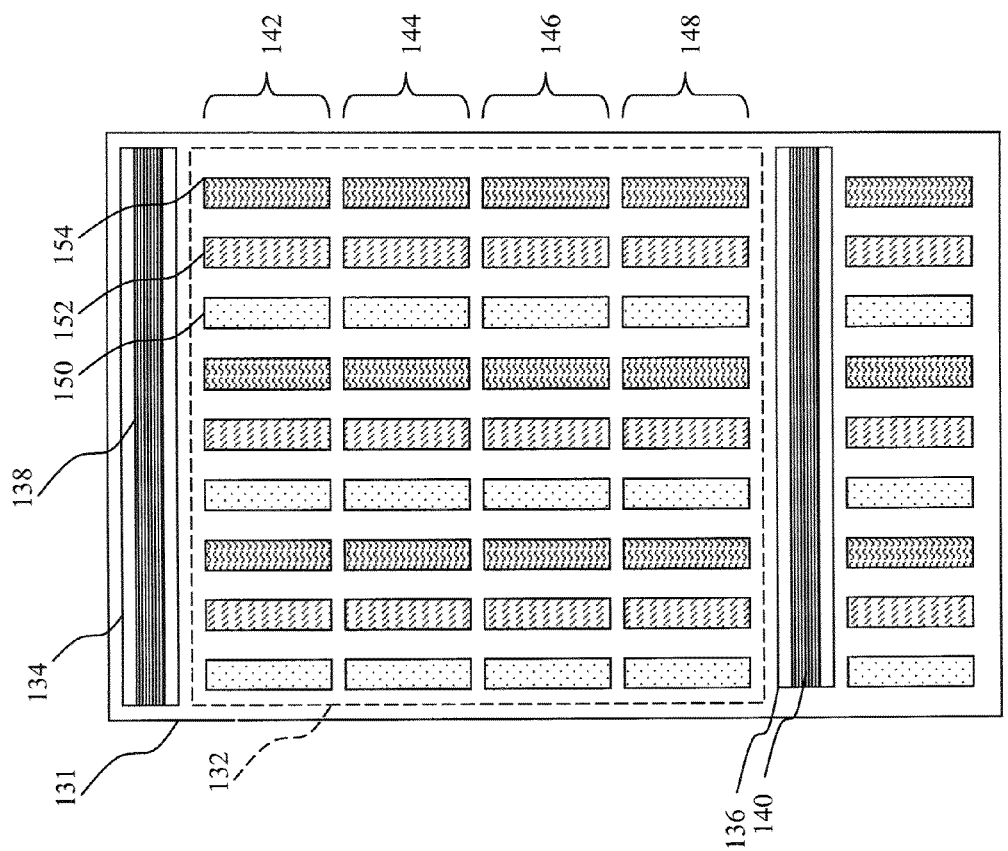
FIG. 5 is a top view of a portion of a display according to an arrangement of the present invention.

Although the controller in FIG. 4 applies to a display having a pixel arrangement similar to the display 2 shown in FIG. 1, similar processing is applied in other pixel arrangements. FIG. 5 shows a portion of an electro-luminescent (EL) display area 131 including a pixel group 132 between a pair of gutters 134, 136 with each gutter containing one or more electrical elements 138, 140. As shown in FIG. 5, the pixel group 132 includes four unique rows of pixels 142, 144, 146, 148. Each of these rows of pixels 142, 144, 146, 148 contains a repeating pattern of pixels that each include a repeating pattern of subpixels 150, 152, 154 for emitting red, green, and blue light, respectively. In an arrangement such as this, the rows of pixels 144 and 146 provide light over a vertical direction including the height of a subpixel and the vertical separation between two rows of subpixels within the pixel group 132. However, the rows of pixels 142 and 148 provide light over a vertical dimension including the height of the subpixels, half the vertical separation between subpixels, and half the dimension of the gutter. The gutter in a display of the present invention has a dimension that is greater than the pixel separation in the vertical direction and therefore, if all the pixels were driven to produce the same luminance, the overall luminance of the region containing the pixels near the gutter, that is in rows 142 and 148 and the gutter appears to the user to be less than the overall luminance of pixels in the pixel group that are separated from the gutter by at least one row of pixels, that is pixels in rows 144, 146. Therefore, artifacts are reduced by increasing the relative luminance of the pixels adjacent to the gutter to compensate for this difference in apparent luminance.

Figure 6:
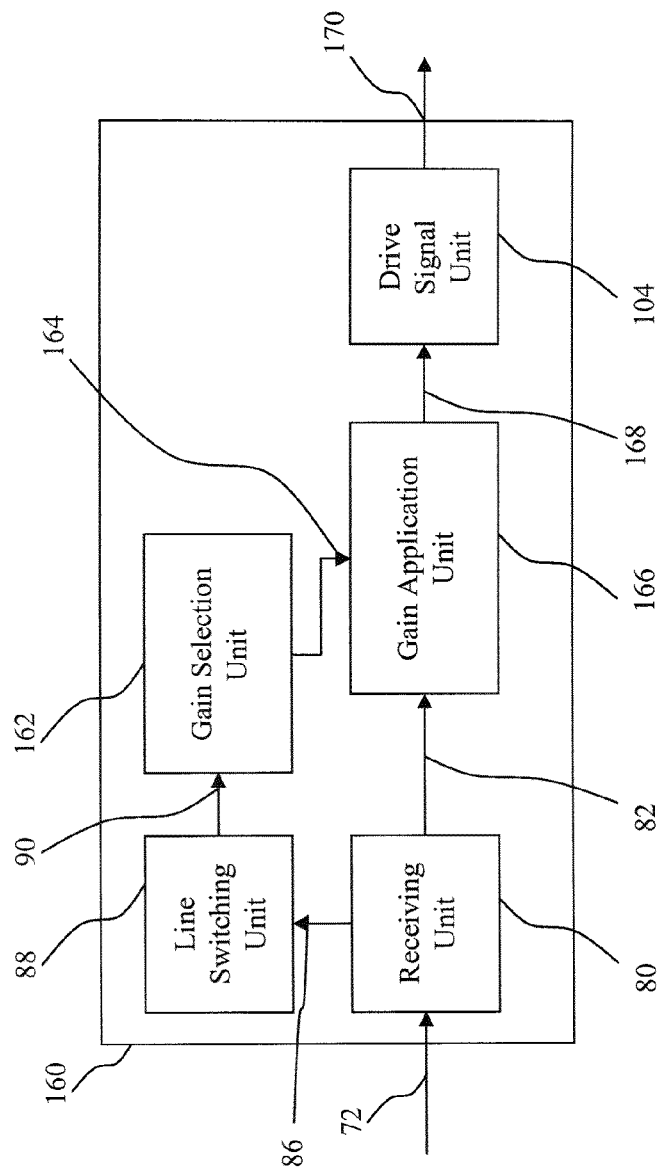
FIG. 6 is a schematic diagram of a controller useful in an arrangement of the present invention.

This adjustment in the luminance of rows of pixels is provided within one arrangement of the present invention further providing the controller shown in FIG. 6. This controller 160 has some of the same components as shown in the controller of FIG. 3 and in some arrangements the unique functions of this controller are integrated with the functions of the controller 70 in FIG. 3. As shown in this figure, the controller 160 receives an input image signal 72, and supplies this input image signal to a receiving unit 80. This receiving unit performs any processing necessary to format the data, including decompressing the input image signal or converting the color space of the input image signal. The received input image signal 82 is a three-color input image signal containing three input signal values for each pixel represented in the input image signal and can be fed into the gain application unit 166. Simultaneously, the receiving unit provides end-of-line signals 86 indicating the end of a line corresponding to a rescan signal within the input image signal 72 to a line-switching unit 88. This line-switching unit 88 provides a line selection signal 90. This line-selection signal 90 will indicate the location of the line in the input image signal 72 with respect to a gutter 12 on the display depicted in FIG. 5. For instance, line-selection signal 90 will indicate a 1 for a row of pixels adjacent to a gutter and a 2 for a row of pixels that are not adjacent to a gutter. In some arrangements, such as when pixels are oriented perpendicularly to the gutters shown in FIG. 5, the line-switching unit 88 can also provide a different code for each pixel of data that is provided within the line-selection signal 90. In response to the line selection signal 90, the gain selection unit 162 will select and provide a gain signal 164. This gain value will be larger for rows of pixels adjacent to a gutter than for rows of pixels, which are not adjacent to a gutter. The gain application unit 166 will receive both the gain signal 164 and the received input image signal 82 and will apply the gain signal 164 to the received input image signal 82. The gain application unit 166 then provides the gained signal 168 to the drive signal unit 104, which provides the drive signal 170 to present an image on the display. By providing such a controller, the display further includes a controller for receiving an input image signal and in response to a flat-field input image signal controlling the luminance of the pixels such that the pixels adjacent to the gutters provide more luminance than the remaining pixels.

Figure 7:
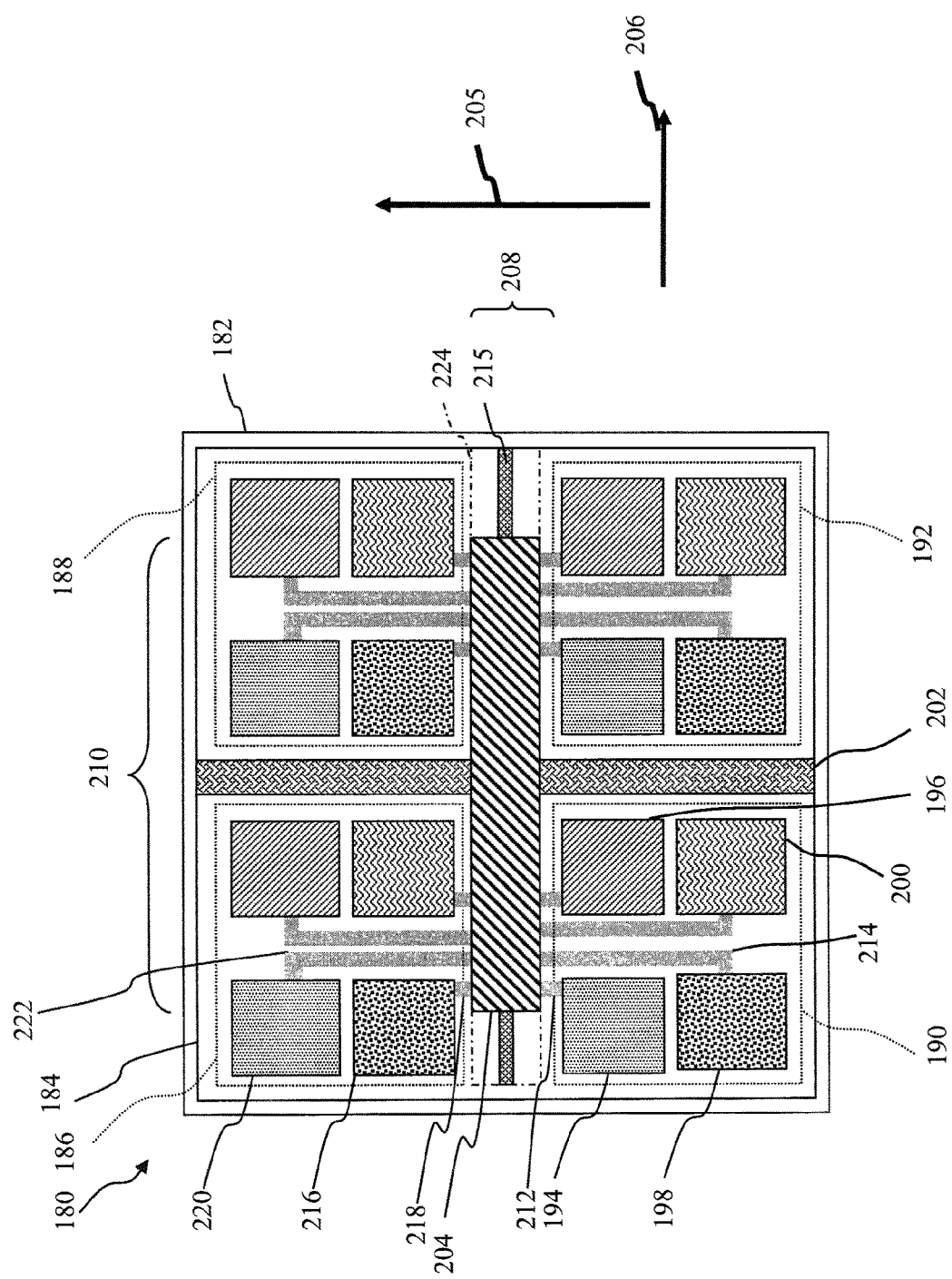
FIG. 7 is a top view of a portion of a display employing chiplets according to an arrangement of the present invention.

The present invention has particular advantage when certain electrical elements are restricted in size, such that they are larger than the inter-pixel separation. FIG. 7 shows one such arrangement. As shown in FIG. 7, a portion of an EL display is formed. This portion of an EL display includes a substrate 182 and a display area 184 smaller than the substrate 182. As shown, this portion of an EL display includes four pixels 186, 188, 190, 192. Each pixel includes four subpixels 194, 196, 198, 200, which emit red, green, blue and white light, respectively, in response to an electrical current. Within this arrangement, power is provided on power buss 202 to provide current for illuminating the subpixels within each pixel.

To control these subpixels a chiplet 204 is attached to the power buss 202 and to each subpixel in the four pixels 186, 188, 190, 192. A "chiplet" is a separately fabricated integrated circuit, which is mounted and embedded into the display device. Much like a conventional microchip (or chip) a chiplet is fabricated from a substrate and contains integrated transistors as well as insulator layers and conductor layers, which are deposited and then patterned using photolithographic methods in a semiconductor fabrication facility (or fab). These transistors in the chiplet are arranged in a transistor drive circuit to drive the electrical current to pixels of the display. A chiplet is smaller than a traditional microchip and unlike traditional microchips, electrical connections are not made to a chiplet by wire bonding or flip-chip bonding. Instead, after mounting each chiplet onto the display substrate, deposition and photolithographic patterning of conductive layers and insulator layers continues. Therefore, the connections can be made small, for example through using vias 2 to 15 micrometers in size. Because the chiplet is fabricated on a separate substrate and deposited onto the display substrate, manufacturing and handling of these chiplets can be expensive. However, in the present invention, the number of chiplets is reduced by creating chiplets that are capable of driving multiple pixels, such as pixels 186, 188, 190, 192. However, to reduce artifacts, it is desirable for the chiplet to have a dimension as small as possible. Therefore, as shown, the chiplet 204 has a first chiplet dimension 208 in the first direction, as indicated by the direction of arrow 205, and a second chiplet dimension 210 in a second orthogonal direction, as indicated by the direction of the arrow 206. The first chiplet dimension 208 is smaller than the second chiplet dimension 210.

These chiplets are then attached to the subpixels in the display through electrical connectors. For example, subpixel 194 is connected to the chiplet by electrical connector 212 and subpixel 198 is connected to the chiplet 204 by electrical connector 214. As shown, in FIG. 7, each chiplet in this arrangement modulates current from the power buss 202 to four rows of subpixels in the first direction. Subpixels 216 and 220 in addition to 194 and 198 are arranged in the same first direction as indicated by the direction of arrow 205. These subpixels are also connected to the chiplet 204 by electrical connectors 218 and 222. According to this invention, the chiplet 204 is located in a gutter 224. Also shown in the gutter is a select line 215. This select line 215 will provide data to each chiplet 204 in the display to indicate the desired drive level for each subpixel attached to the chiplet 204. Circuits within the TFT then modulate the flow of current from the power buss 202 through electrical connectors, including electrical connector 212, to each of the subpixels, including subpixel 194. As such, the one or more electrical elements arranged within the gutter farther include a plurality of chiplets, electrically connected to subpixels by electrical connectors to drive the subpixels to emit light. These electrical connectors are directly connected to each chiplet.

Figure 8:
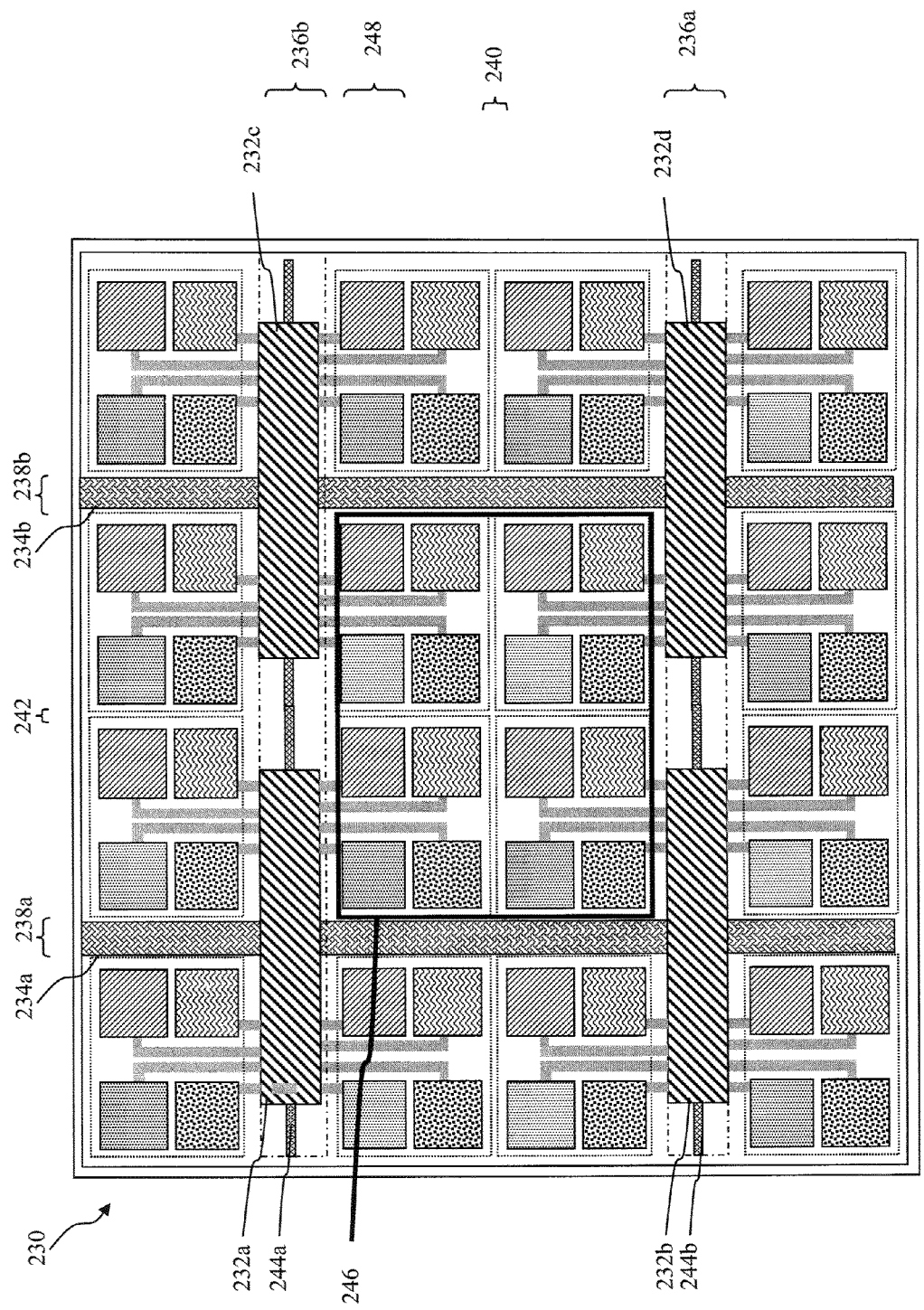
FIG. 8 is a top view of a larger portion of the display of FIG. 7.

Display portions 180 are then tiled to form larger portions of a display. FIG. 8 shows a portion of a display 230 that includes four chiplets 232a, 232b, 232c, and 232d and two power busses 234a, 234b. Each of these chiplets 232a, 232b, 232c, 232d and power busses 234a, 234b lie within a gutter with the chiplets lying within a gutter in a first direction having a first gutter dimension 236a, 236b and the power busses 234a, 234b lying within a gutter within a second direction having a second gutter dimension 238a, 238b. Between these two gutters, a pixel group 246 is formed that includes four pixels and each pixel including four subpixels. A vertical and a horizontal inter-pixel separation 240, 242 exists between pairs of these pixels and these inter-pixel separations 240, 242 are smaller than either the gutter dimension 236a, 236b in the first direction or the gutter dimension 238a, 238b in the second direction. Each of the chiplets 232a, 232b, 232c, 232d, the power busses 234a, 234b and the select lines 244a, 244b are electrical elements that are formed within the gutters and electrical connections are formed between these elements and subpixels within the pixel group 246. As such, at least one of the one or more electrical elements arranged within the gutter include a chiplet electrically connected to the subpixels to drive the sub-pixels to emit light. Also shown are buss lines that are located at least partially between the pixel groups 246 and conduct power or ground signals.

Each subpixel also has a subpixel of pixel size 248 in the first direction. Through experimentation, it has been shown that the gutter dimension 236a, 236b in the first direction should be equal to or less than the subpixel dimension 248 in the first direction to reduce artifacts. Other experimentation has demonstrated that by placing a non-uniform surface outside the subpixel area, for example forming bank layers around the chiplets 232a, 232b, 232c, 232d which are elevated above the subpixel, light is scattered outside the subpixel area causing light to be emitted from the EL display in this region and masking the dark region of the gutter. Thus it is useful for the display to further include a light scattering structure or material located adjacent to or within the gutter.

Figure 9:
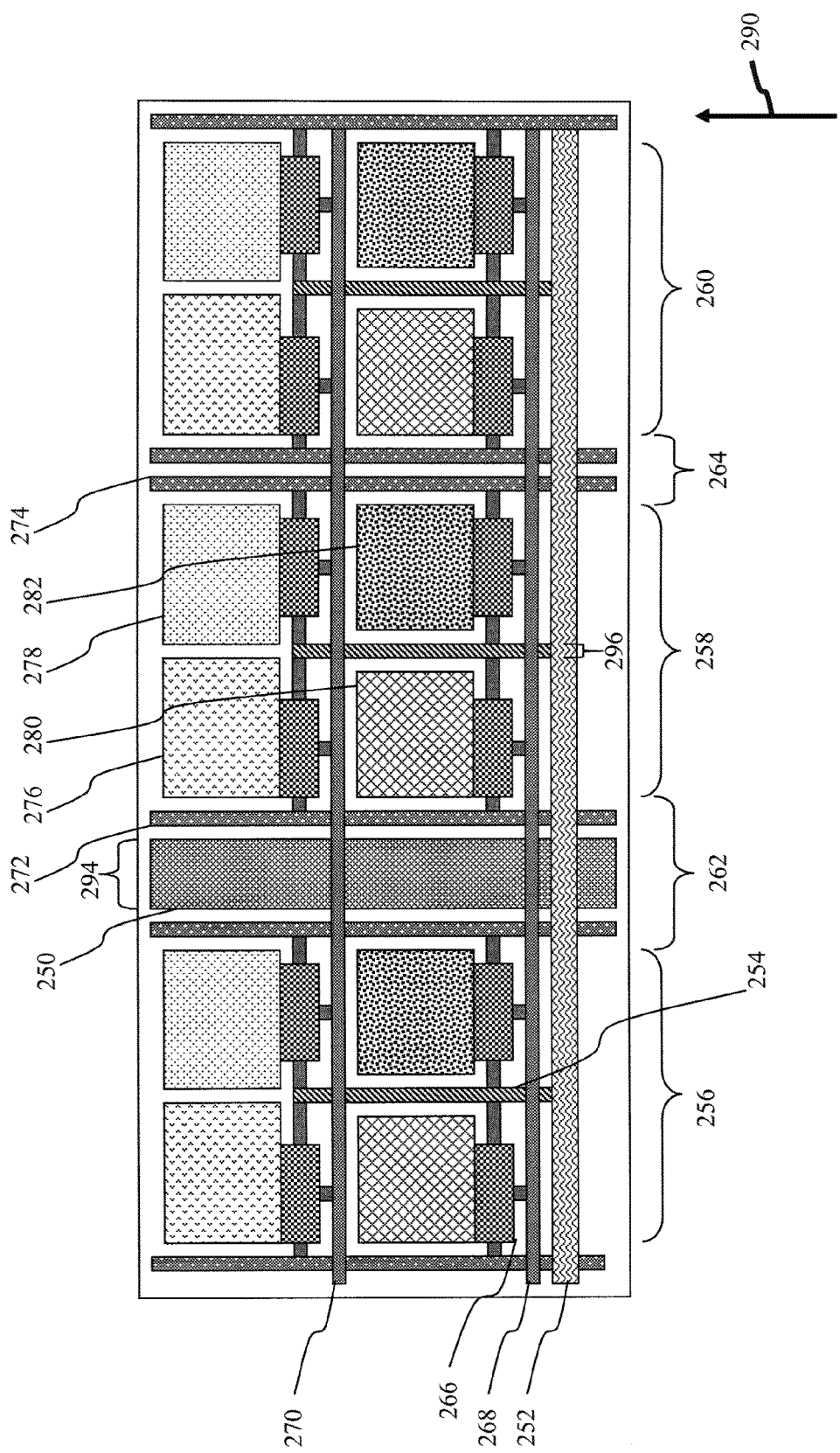
FIG. 9 is a schematic of a top view of a display employing a traditional TFT backplane according to an arrangement of the present invention.

Although arrangements of the present invention are desirably employed in displays using chiplets to modulate current to subpixels, displays utilizing traditional thin-film-transistor (TFT) backplane technology benefit from some arrangements of the present invention. Specifically, large, high-resolution displays employing thin-film-transistor backplane technology in combination with an emissive display technology, such as electro-luminescent (EL) displays, benefit. In this class of display, it is necessary to employ power busses with a large cross-sectional area since these busses provide significant current over large distances as these power busses extend at least from an edge of the display to a distance at least half the height or width of the display, that is it extends over a dimension that is at least half a dimension of the display area. Therefore, the display includes buss lines for conducting power or ground signals located at least partially between the pixel groups. Without using a large cross-sectional area, the resistivity of these power busses will be such that providing the necessary current over these large distances will result in significant voltage drop due to IR losses along the power line. In displays employing thin-film-transistor technology, the thickness of the power busses is typically constrained by the thickness of the thin-film transistor and therefore, the need for a large cross-sectional area translates into a wide power buss. For large high-resolution displays, the subpixels will be small and therefore in large emissive displays having a high resolution, the power busses often require a dimension on the order of the largest dimension of a subpixel as is depicted in FIG. 9. In traditional backplanes, the power busses 250 would typically be placed between every pixel. For example, the power busses 250 are located between pixels 256 and 258, as well as between pixels 258 and 260. However, this arrangement significantly reduces the subpixel aperture ratio.

As shown in FIG. 9, a power buss 250 is formed in a gutter having a dimension 262 in a first direction. This power buss 250 is formed in a first metalization layer of the backplane, as are all vertical electrical wiring connections. To help with power distribution, a second power buss 252 is formed within a second metalization layer of the backplane and attached to the power buss 250 through a via (not shown). All horizontal electrical wiring connections are formed within this second metalization layer separated from the first metalization layer by an insulating layer and connected where necessary by vias to the first metalization layer using methods that are obvious to ones skilled in the art. TFT circuits 266 are formed for each subpixel and attached to the power buss 252 by an electrical connector 254. In an arrangement, this electrical connector 254 is formed in the first metalization layer and attached to the power buss 252. Other necessary electrical elements, including select lines 268, 270 and data lines 272, 274 are formed and attached to the TFT circuits 266 as required. Any known TFT circuit known in the art can be applied within arrangements of the present invention. As shown, each pixel 256, 258, 260 is comprised of four subpixels 276, 278, 280, 282 for emitting different colors of light.

Important in the present invention, however, is that the gutter dimension 262 in a horizontal direction is larger than the inter-pixel spacing 264 in the horizontal dimension for pixels 258, 260 within a pixel group. As discussed, this arrangement provides a display in which one or more electrical elements, specifically the power buss 250, is arranged within a gutter. This buss line has a dimension and will extend across at least one half of the display area. Electrical connectors having a second dimension smaller than the buss dimension and are connected to one or more circuits located in the display area for driving the subpixels to emit light. Further as shown, the buss dimension is at least two times the dimension of the electrical connectors. Further, one of the one or more electrical elements (i.e., the power buss 250) arranged within the gutter defines an element dimension 294 and extends in a selected direction, for example the first direction indicated by arrow 290, across at least one half of the display area, the display further includes one or more electrical connector(s) 254 defining respective connector dimension(s) 296 smaller than the element dimension in the selected direction, and further includes one or more circuit(s) 266 located in the display area for driving the subpixels 276, 278 to emit light, wherein each of the one or more electrical connector(s) 254 is connected to one or more of the circuit(s) 266.

In a preferred arrangement, the EL display of the present invention is an organic electro-luminescent display wherein each subpixel includes an organic electro-luminescent emitter, or specifically an Organic Light Emitting Diodes (OLEDs). These OLED emitters are composed of small molecule or polymeric OLEDs as disclosed in but not limited to U.S. Pat. No. 4,769,292, by Tang et al., and U.S. Pat. No. 5,061,569, by VanSlyke et al. Many combinations and variations of organic light emitting materials can be used to fabricate such a panel. In such embodiments, the increased aperture ratio provided by the present invention reduces the current density required from each subpixel to obtain a desired peak luminance. Within this technology, fill factor is particularly limited by the size of power busses within the display and the reduced current density provided by an increase in fill factor directly extends the lifetime of the organic light-emitting materials within the OLEDs, making the present invention particularly desirable within this particular display technology.

The invention has been described in detail with particular reference to certain preferred arrangements thereof, but it will be understood that variations and modifications can be effected within the spirit and scope of the invention.

PARTS LIST 2 portion of display
4 substrate
6 display area
8 first pixel group
10 second pixel group
12 gutter
14 gutter dimension
16 arrow indicating first direction
20 pixel
22 pixel
24 pixel adjacent to a gutter
26 pixel adjacent to a gutter
30 subpixel for emitting green light
32 subpixel for emitting red light
34 subpixel for emitting blue light
36 subpixel for emitting a different color of light
38 pixel center
40 pixel center
42 pixel center
44 pixel center
46 inter-pixel separation
48 electrical element
50 element dimension
54 subpixel
56 subpixel
58 gutter dimension
60 pixel group
62 gutter
64 inter-pixel separation
66 arrow indicating a second direction
70 controller
72 input image signal
74 drive signal
80 receiving unit
82 received input image signal
84 buffer unit
86 end of line signal
88 line switching unit
90 line selection unit
92 interpolation coefficient selection unit
94 selection and interpolation signals
96 interpolation coefficient storage unit
98 buffered input image signal
100 interpolation unit
102 interpolated signal
104 drive signal unit
106 interpolation coefficient signal
112 min unit
114 mixing ratio selection unit
116 white mixing ratio signal
118 min signal
120 calculate W unit
122 W signal
124 subtract W unit
126 RGBW signals
128 drive signal unit
130 controller
131 portion of an EL display area
132 pixel group
134 gutter
136 gutter
138 electrical element 140 electrical element
142 row of pixels
144 row of pixels
146 row of pixels
148 row of pixels
150 repeating pattern of subpixels
152 repeating pattern of subpixels
154 repeating pattern of subpixels
160 controller
162 gain selection unit
164 gain signal
166 gain application unit
168 gained signal
170 drive signal
180 display portion
182 substrate
184 display area
186 pixel
188 pixel
190 pixel
192 pixel
194 subpixel
196 subpixel
198 subpixel
200 subpixel
202 power buss
204 chiplet
205 arrow
206 arrow
208 first chiplet dimension
210 second chiplet dimension
212 electrical connector
214 electrical connector
215 select line
216 subpixel
218 electrical connector
220 subpixel
222 electrical connector
224 gutter
230 portion of a display
232a chiplet
232b chiplet
232c chiplet
232d chiplet
234a power buss
234b power buss
236a first gutter dimension
236b first gutter dimension
238a second gutter dimension
238b second gutter dimension
240 inter-pixel separation
242 inter-pixels separation
244a select line
244b select line
246 pixel group
248 subpixel dimension
250 power buss
252 power buss
254 electrical connector
256 pixel
258 pixel
260 pixel
262 gutter dimension
264 inter-pixel dimension
266 TFT circuit
268 select line
270 select line
272 data line
274 data line
276 subpixel
278 subpixel
280 subpixel
282 subpixel
290 arrow indicating first direction
294 dimension of electrical element within gutter
296 connector dimension

The invention claimed is:

1. A display, comprising:
a) a substrate having a display area less than the size of the substrate, wherein the display area includes a first, second, and third non-overlapping pixel group and a first gutter located between the first and the second pixel group, the first gutter has a dimension in a first direction separating the first and second pixel groups, the first gutter dimension being measured between the first and the second pixel group in the first direction, a second gutter located between the first and the third pixel group and having a second gutter dimension measured between the first and third pixel group in the second direction and each pixel group includes:
   i) a plurality of pixels, each pixel having three or more differently colored sub-pixels; and
   ii) wherein the pixel centers of the pixels in each pixel group are arranged in a regular two-dimensional array having one dimension parallel to the first direction, and wherein the pixels within a pixel group are separated by an inter-pixel separation dimension in the first direction; and
b) one or more electrical elements arranged within the first and second gutters, each subpixel in a pixel groups being connected to one of the one or more electrical elements, wherein both the first and second gutter dimensions are greater than the respective dimensions of the inter-pixel separation in the respective directions of the pixel groups, so that artifacts in a displayed image are reduced.

2. The display of claim 1, wherein each pixel group includes three or more subpixels arranged in the first direction.

3. The display of claim 1, wherein a subpixel in a pixel group has a dimension in the first direction, and the gutter dimension is equal to or less than the dimension of the subpixel in the first direction.

4. The display of claim 1, wherein the first direction and the second direction are orthogonal.

5. The display of claim 1, wherein each pixel includes a repeating arrangement of four subpixels, each subpixel emitting a different color of light, and each pixel includes at least two subpixels for emitting corresponding different colors of light in the first direction, wherein each pixel group includes multiple pixels in the first direction.

6. The display of claim 5, further including a controller for receiving an input image signal and in response to a flat-field input image signal controlling the luminance of the subpixels such that subpixels adjacent to the gutters provide more luminance than the remaining subpixels.

7. The display of claim 1, further including a controller for receiving an input image signal and in response to a flat-field input image signal controlling the luminance of the pixels such that the pixels adjacent to the gutters provide more luminance than the remaining pixels.

8. The display of claim 1, wherein the one or more electrical elements arranged within the gutter include a chiplet electrically connected to the subpixels to drive the sub-pixels to emit light.

9. The display of claim 8, wherein the chiplet has a first chiplet dimension in the first direction and a second chiplet dimension in a second orthogonal direction, the first chiplet dimension smaller than the second chiplet dimension.

10. The display of claim 1, further comprising a light scattering structure or material located adjacent to or within the gutter.

11. The display of claim 1, further including buss lines for conducting power or ground signals located at least partially between the pixel groups.

12. The display of claim 11, wherein the one or more electrical elements arranged within the gutter further include a plurality of chiplets, electrically connected to subpixels by electrical connectors to drive the subpixels to emit light.

13. The display of claim 1, wherein one of the one or more electrical elements arranged within a gutter defines an element dimension and extends in a selected direction across at least one half of the display area, the display further including one or more electrical connector(s) defining respective connector dimension(s) smaller than the element dimension in the selected direction, and further including one or more circuit(s) located in the display area for driving the subpixels to emit light, wherein each of the one or more electrical connector(s) is connected to one or more of the circuit(s).

14. The display of claim 1, wherein the display is an organic electroluminescent display, and wherein each subpixel includes an organic electroluminescent emitter.

* * * * *